US007057821B2

(12) United States Patent
Zincone

(10) Patent No.: US 7,057,821 B2
(45) Date of Patent: Jun. 6, 2006

(54) INTEGRATED ARTIFICIAL AND NATURAL LIGHTING SYSTEM

(76) Inventor: Robert Zincone, 26 Terra Nova Cir., Westport, CT (US) 06880

( * ) Notice: Subject to any disclaimer, the term of this patent is extended or adjusted under 35 U.S.C. 154(b) by 0 days.

(21) Appl. No.: 10/934,678

(22) Filed: Sep. 3, 2004

(65) Prior Publication Data

US 2006/0007549 A1 Jan. 12, 2006

Related U.S. Application Data

(60) Provisional application No. 60/514,943, filed on Oct. 28, 2003.

(51) Int. Cl.

| | |
|---|---|
| ***G02B 17/00*** | (2006.01) |
| ***G02B 27/00*** | (2006.01) |
| ***H01L 25/00*** | (2006.01) |
| ***G01J 1/04*** | (2006.01) |
| ***F21V 23/02*** | (2006.01) |

(52) U.S. Cl. ...................... 359/595; 359/593; 359/594; 359/598; 136/246; 136/251; 250/227.11; 362/260; 362/800; 385/900

(58) Field of Classification Search ........ 359/591–598; 136/246, 251, 291; 250/227.11; 362/257, 362/260, 800; 385/900
See application file for complete search history.

(56) References Cited

U.S. PATENT DOCUMENTS 4,326,012 A * 4/1982 Charlton ........................ 429/9
4,529,830 A * 7/1985 Daniel ........................ 136/246
5,528,471 A 6/1996 Green
5,716,442 A * 2/1998 Fertig ........................ 136/246
6,730,840 B1 * 5/2004 Sasaoka et al. ............. 136/246
6,895,145 B1 * 5/2005 Ho .............................. 385/35
2002/0053879 A1 * 5/2002 Thoma et al. ................ 315/86

* cited by examiner

*Primary Examiner*—W. B. Perkey
*Assistant Examiner*—Magda Cruz
(74) *Attorney, Agent, or Firm*—Fattibene & Fattibene; Paul A. Fattibene; Arthur T. Fattibene

(57) ABSTRACT

An artificial and natural lighting system placed in the roof of a building that is substantially self-contained and powered. A photovoltaic cell provides electricity stored in a battery to power light emitting diodes. A highly reflective interior coating applied to the light shaft maximizes lighting intensity. A sensor detects illumination intensity and temperature within the light shaft to control the balance of natural and artificial light provided to maintain predetermined illumination intensity. The light shaft is insulated to reduce heat transfer and a thermal collector removes heat from the building. In one embodiment, a Fresnel lens is utilized to focus natural light onto the photovoltaic cell. In another embodiment, conventional fluorescent lighting powered by external line voltage is combined with light emitting diodes powered primarily by a rechargeable battery. The present invention, being substantially self-contained, is easily retrofitted to existing buildings with a minimum of connections and provides substantial energy efficiencies in illuminating the building.

28 Claims, 4 Drawing Sheets

INTEGRATED ARTIFICIAL AND NATURAL LIGHTING SYSTEM

RELATED APPLICATION

This application claims the benefit of U.S. Provisional Application No. 60/514,943, filed Oct. 28, 2003.

FIELD OF THE INVENTION

The present invention relates in general to a sky window or skylight for providing natural and artificial light into a building, and more particularly to a highly efficient self-contained lighting system capable of being independent of external power sources.

BACKGROUND OF THE INVENTION

Skylights or sky windows have often been used to illuminate the interior of buildings. Most skylights are passive devices that act as windows relying completely on natural daylight for illuminations. Some skylights have combined the benefits of natural lighting with artificial lighting. One such skylight is disclosed in U.S. Pat. No. 5,528,471 entitled “Skylight And Lamp Combination” issuing to Green on Jun. 18, 1996. Therein disclosed is a skylight and lamp combination for providing natural and artificial light to a room. A plurality of lamp fixtures is disposed within the housing of the skylight for emitting artificial light to the bottom end of the housing. The lamp fixtures are disclosed as being fluorescent light fixtures or incandescent light fixtures of conventional design. A retractable shade is also disclosed. For daytime darkening, the shade or blind is rolled over and the fluorescent lights are used alone or not depending on the shading needed during the day.

While most skylights incorporating lamps or artificial lighting extend the practicality of skylights and their use for providing light when natural light is not available, they are often difficult to retrofit and require external power to energize the lamps or artificial lighting. The need to connect to an external power source makes the installation more complicated and may limit design flexibility. Additionally, the combination of artificial lighting and skylights is generally efficient and does reduce energy consumption, but still requires an external power source.

Therefore, there is a need for a more efficient, self-contained natural and artificial lighting system that is easily installed, is energy efficient, and substantially reduces the need for external energy sources or power connections.

SUMMARY OF THE INVENTION

The present invention comprises a self-contained unit, window, skylight, or light well placed in the roof of a building for providing artificial and natural light efficiently without requiring a connection to any external power source. The skylight comprises a solar or photovoltaic cell for producing electricity, which is stored in rechargeable batteries. Light emitting diodes or LEDs and/or fluorescent lamps are used to provide artificial illumination when natural light is not available. A heat exchanger is used to remove heat from the interior of the skylight and transfer it to the outside. The skylight is sealed with a top and bottom diffuser lens. A lens on the top diffuser is utilized to concentrate and direct natural light onto the solar or photovoltaic cell. A sensor is coupled to a controller and detects light and temperature conditions in the interior of the skylight or unit for maintaining a predetermined condition within the interior of the skylight. A sensor may also be used exterior to the skylight within a building for detecting the intensity of light within the building and for providing a predetermined intensity and duration of artificial illumination inside the building as predetermined by a user.

In another embodiment of the invention, solar or photovoltaic cells are angularly disposed on the surface of the interior walls of the skylight shaft. The solar or photovoltaic cells provide energy to a rechargeable battery or other storage device for powering an array of light emitting diodes or LEDs and or fluorescent lamps.

In another embodiment of the invention, the photovoltaic cells may be placed outside of or external to the skylight or light well.

In another embodiment of the invention, the skylight comprises a self-contained unit powering light emitting diodes or LEDs in combination with fluorescent lights that are selectively energized with a relay depending upon lighting needs or the amount of natural light. The use of a relay makes possible the selective energizing of the plurality of fluorescent lamps utilizing only a single power line connection.

It is an object of the present invention to provide an energy efficient lighting system solution to buildings.

It is another object of the present invention to combine natural light and artificial lighting that is substantially independent of external power supplies.

It is an advantage of the present invention that it reduces heat build up in the light shaft and heat transfer into the building.

It is another advantage of the present invention that it is easily retrofitted into existing skylights in buildings.

It is another advantage of the present invention that excess heat may be utilized to heat hot water for use in the building.

It is a feature of the present invention that photovoltaic cells are used as an energy source.

It is a further feature of the present invention that relatively high powered color rendition index light emitting diode sources are used.

It is yet another feature of the present invention that a freznel lens is used to direct light onto the solar or photovoltaic cells.

It is yet another feature of the present invention that highly reflective sides in the light shaft are used to maximize the light transmitted and reduce heat buildup.

It is another feature of the present invention that a thermal collector and heat exchanger are used to remove heat from within the skylight.

These and other objects, advantages, and features will become readily apparent in view of the following, more detailed description.

DETAILED DESCRIPTION OF THE PREFERRED EMBODIMENTS

Figure 1:
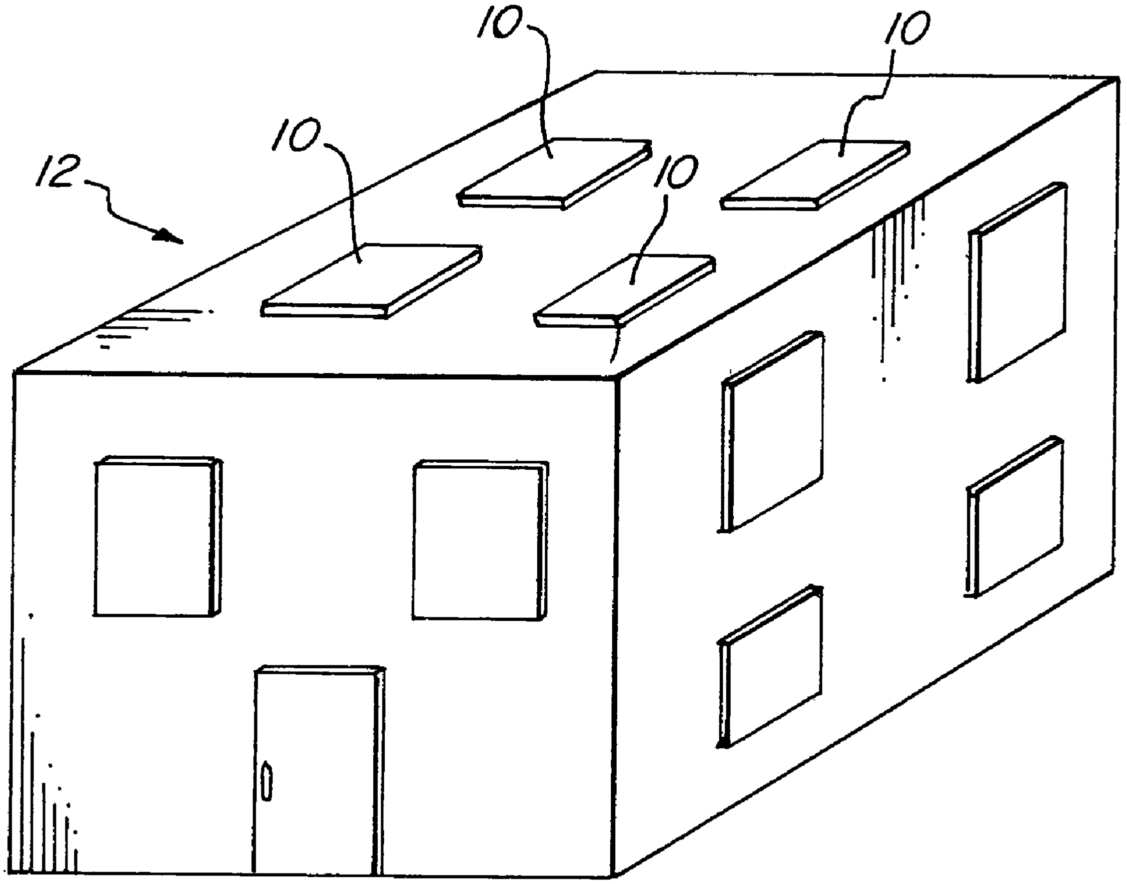
FIG. 1 illustrates a skylight or illumination unit placed in a building.

FIG. 1 illustrates schematically a building 12 having a plurality of skylights, sky windows, illumination units, or combined natural and artificial lighting systems 10 installed. The illumination unit or lighting system 10 of the present invention is applicable to both commercial and residential applications.

Figure 2:
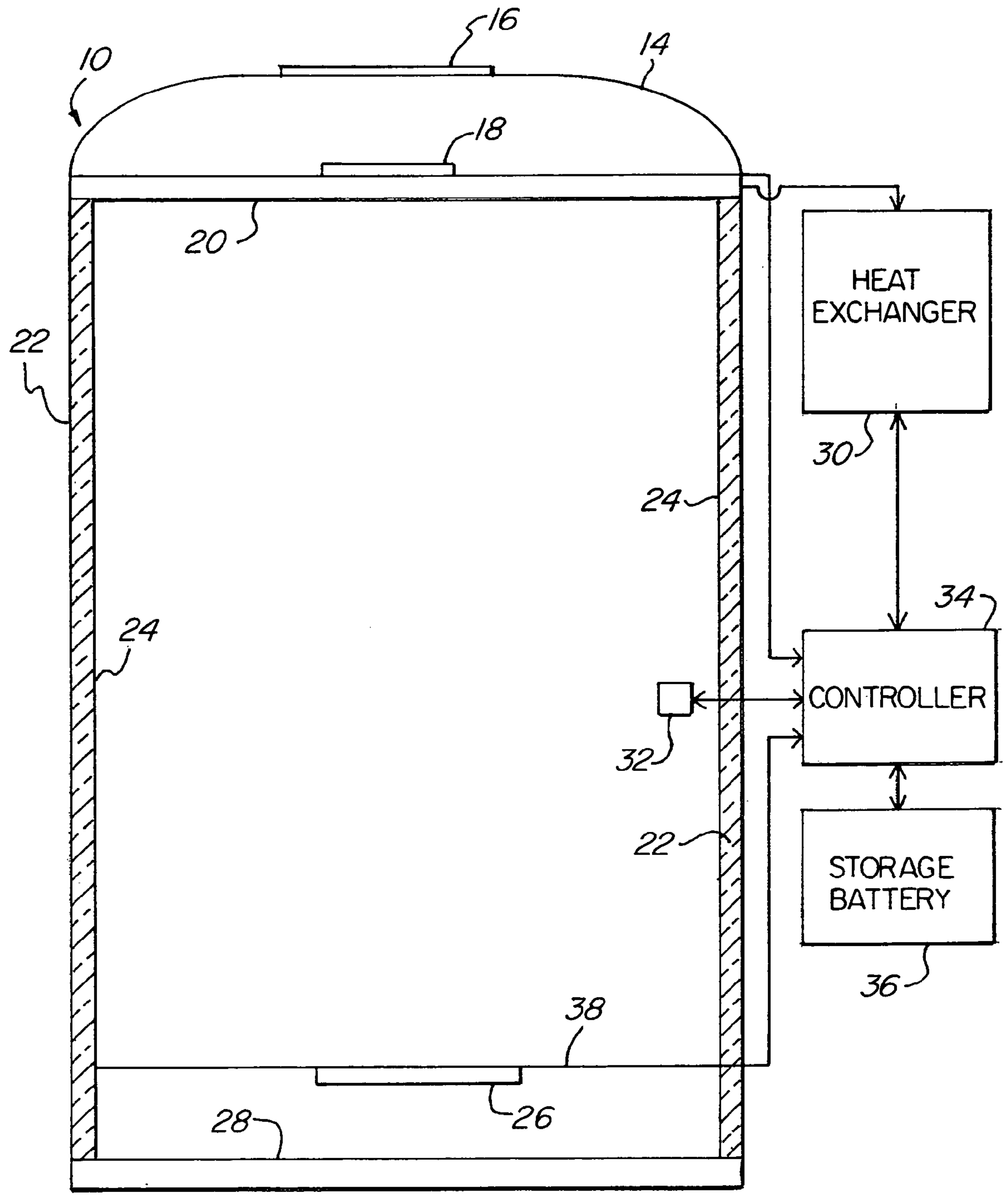
FIG. 2 schematically illustrates an illumination unit or skylight according to an embodiment of the present invention.

FIG. 2 schematically illustrates one embodiment of the lighting system of the present invention. Illumination unit or lighting system 10 has a top diffuser 14. Placed on the top diffuser 14 is a lens 16. Lens 16 is preferably a Fresnel lens. The lens 16 concentrates natural light onto a photovoltaic or solar cell 18. Preferably the lens 16 adjacent the diffuser 14 has a surface area or size that is relatively small compared to the surface area or size of the diffuser 14. Preferably, the surface area of the lens 16 is less than ten percent of the surface area of the diffuser 14. This permits sufficient natural light to be used for illumination. However, due to the focusing of the natural light, the photovoltaic or solar cell 18 may be made smaller than the surface area of the lens 16 and will generally be more efficient. The photovoltaic or solar cell 18 may be held in position by any means, but may preferably rest on a thermal collector 20. The thermal collector 20 may be any grating, tubular, finned, or other structure for collecting thermal energy. The thermal collector 20 permits light to pass there through for illumination. Insulated walls 22 may form a light shaft of the illumination unit or lighting system 10. On the interior surface of the insulated walls 22 or the interior of the illumination unit or lighting system 10 are highly reflective surfaces 24.

Near the bottom of the illumination unit 10 is positioned a light emitting diode array 26. The light emitting diode array 26 may be suspended in position with a support 38, which may be a thin wire so as to prevent the blocking of any natural illumination. A bottom diffuser 28 is used to seal the illumination unit 10. Accordingly, the illumination unit 10 is a sealed structure, which helps prevent any dust or contamination from reducing the efficiency of the illumination unit, skylight, or lighting system 10.

The thermal collector 20 is coupled to a heat exchanger 30 placed externally from the sealed illumination unit or skylight 10. The heat exchanger 30 receives the thermal energy radiated from the thermal collector 20 by any means such as a channel having air or other fluid passing therethrough. The heat exchanger 30 may incorporate a fan, which may be solar powered. In the interior of the sealed illumination unit or skylight 10 are sensors 32. The sensors 32 may utilized a variety of different independent sensors, such as a heat sensor and light sensor so as to accurately determine the conditions within the sealed illumination unit or skylight 10. The sensors 32 are coupled to a controller 34. The controller 34 is coupled to the heat exchanger 30 and the light emitting diode or LED array 26. The controller 34 is also coupled to a rechargeable storage battery 36 and the photovoltaic cell or solar cell 18.

In operation, natural illumination, for example from the sun, enters through the top diffuser 14 and is reflected off the reflective surfaces 24 and emerges from the bottom diffuser 28. Heat generated from the natural illumination is collected by the thermal collector 20 and conducted outside of the sealed illumination unit or skylight 10 to the external heat exchanger 30. The external heat exchanger 30 releases heat to the outside. The lens 16 concentrates and directs natural illumination onto the solar or photovoltaic cell 18, which is used to charge the rechargeable storage battery 36. When natural light is not available, the controller 34 directs power to the light emitting diode array 26. The light emitting diode array 26 provides artificial illumination through the bottom diffuser 28 to the interior of a building. The light emitting diode array 26 may be controlled by the controller to provide any continuous range of intensity of illumination as required by a pre-selected setting or by a user. The system is designed to have a maximum of twelve hours of artificial light and to have the cycle repeated on a daily basis.

Accordingly, in this embodiment the present invention provides a self-contained and sealed illumination unit that provides both natural and artificial light to the interior of a building. The illumination unit is self-contained and does not require any connection to an external power source. Each day the system charges in the day time, and discharges at night. However, a connection may be made to a commercial or external power source or grid to provide backup power should it be required or desired. Additionally, the illumination unit is highly efficient and should be constructed so as to prevent any net heat gain to the interior of the building.

Figure 3:
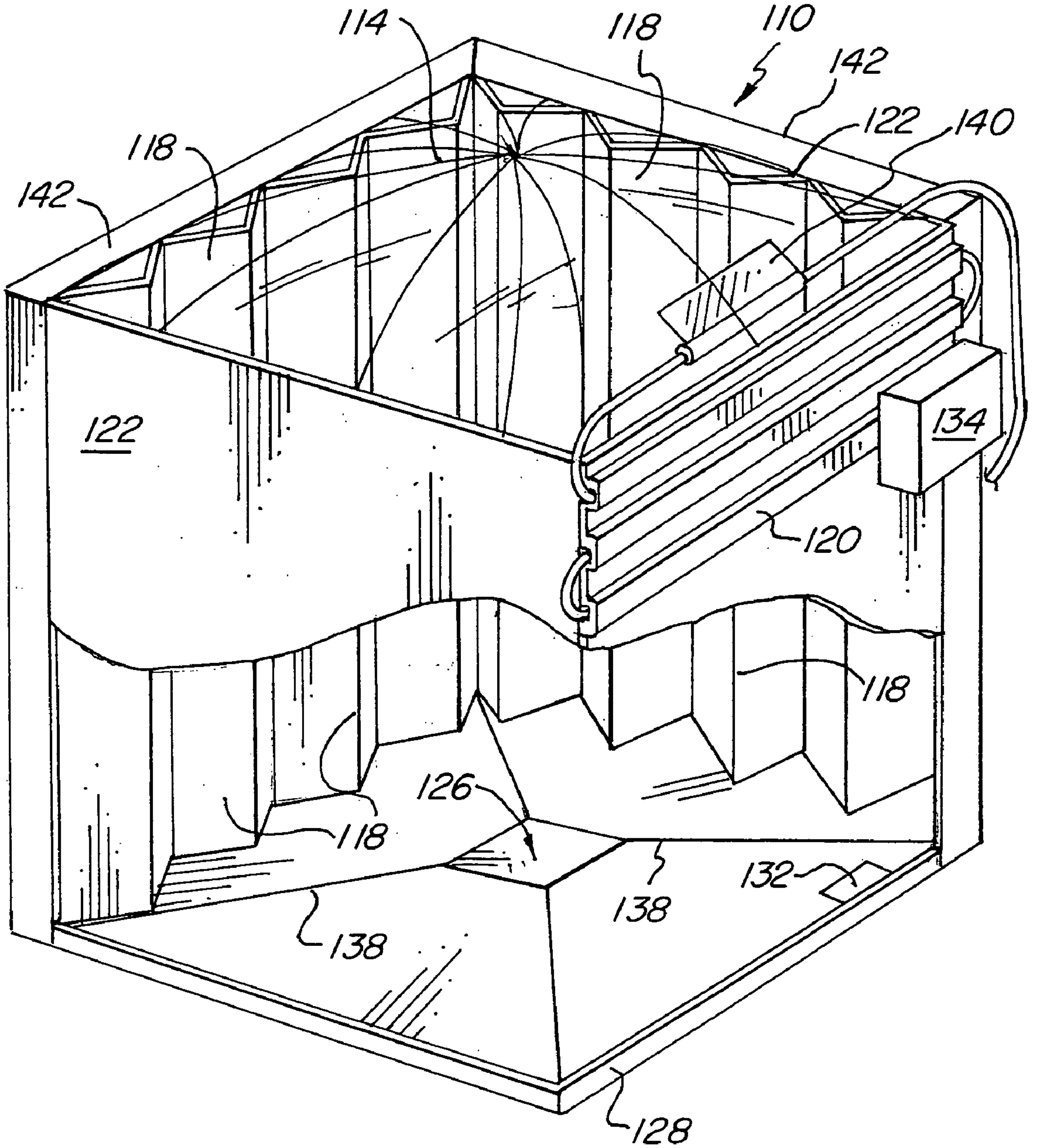
FIG. 3 is a perspective view in partial section schematically illustrating another embodiment of the present invention.

FIG. 3 is a perspective view schematically illustrating in partial section another embodiment of the present invention. The lighting system or self-contained skylight 110 comprises walls 122. The walls 122 were illustrated in partial section so as to more clearly illustrate the interior of the self-contained skylight 110. A top diffuser 114 is formed on one open end of the light shaft rectangular chamber formed by walls 122. The interior surface of walls 122 have placed thereon photovoltaic panels 118. The photovoltaic panels 118 are angularly disposed on the surface of the walls 122. The photovoltaic panels 118 form a polyhedron or a prism shape. The longitude length of the formed polyhedron extends in a direction from the top diffuser 114 to the bottom diffuser 128. The polyhedron in lateral cross section forms a triangle. The photovoltaic panels are angled so as to provide an increased surface area and to better receive the natural light. The photovoltaic panels 118 store energy in a rechargeable battery that may be contained in a controller 134.

The controller 134 is coupled to an array of light emitting diodes 126. The light emitting diode array 126 is suspended centrally by LED support 138. The light emitting diodes may also be placed along the sides of the light well interior. A sensor 132 is also coupled to the controller 134. The sensor 132 detects light intensities and the buildup of heat within the self-contained skylight 110. Thermal collector 120 prevents heat from building up within the self-contained skylight 110 during daylight hours. A solar pump or fan 140 helps circulate a cooling fluid, which may be a gas or a liquid, through the tubing of the thermal collector 120. The solar fan is coupled to the controller 134. The walls 122 may contain insulation 142 on the exterior surface thereof. The insulation helps to prevent heat from passing into the building housing the illumination system 110. Additionally, the photovoltaic panels 118 are preferably highly reflective so as to increase efficiency. The bottom diffuser 128 is placed on the other open end of the rectangular shaped structure or light shaft. Accordingly, the lighting system or skylight 110 is substantially self-contained and sealed, preventing contamination from entering the interior light shaft. In this way, the highly reflective surfaces contained on the photovoltaic panels 118 are kept clean. The highly reflective surfaces are preferably and reflect at least ninety-five percent of the incident light rays or radiation. This embodiment has the benefit of locating the photovoltaic panels 118 within the sealed light shaft protecting them and preventing them from becoming coated with light attenuating contamination over time.

Figure 4:
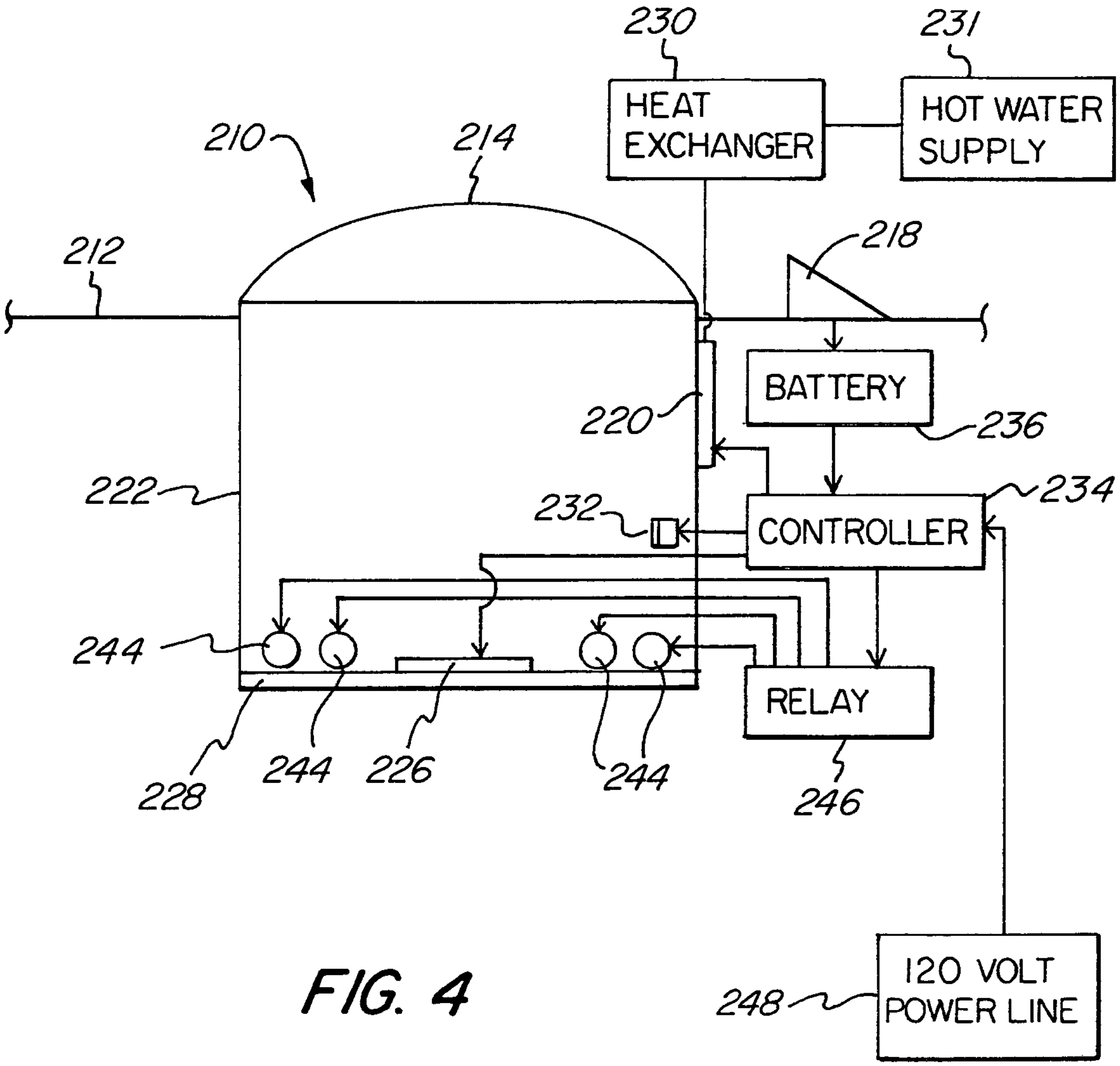
FIG. 4 schematically illustrates another embodiment of the present invention additionally using conventional fluorescent lighting powered by an external source.

FIG. 4 schematically illustrates another embodiment of the present invention that provides a highly efficient lighting system that is combined with conventional fluorescent lighting and that can be readily retrofitted into existing buildings that have fixtures with a single power line connection. The skylight 210 of this embodiment of the present invention comprises walls 222 forming a box structure or light shaft that is dropped through a rooftop 212 in a building. A top diffuser 214 seals an open end of the box structure formed by walls 222. The other open end of the box like structure or light shaft formed by walls 222 is sealed by a bottom diffuser 228. Placed adjacent the bottom diffuser 228 is a light emitting diode array 226. Additionally placed adjacent the bottom diffuser 228 are conventional fluorescent lamps 244. Each of the conventional fluorescent lamps 244 are coupled to a relay 246. The relay 246 individually controls the operation of each of the fluorescent lamps 244. A controller 234 coupled to the relay 246 selectively energizes the individual fluorescent lamp 244, depending upon the desired illumination required. A 120-volt power line 248 is coupled to the controller 234. The use of the relay 246 permits a single power line 248 to effectively be used to energize individually and in a controlled manner the fluorescent lamp 244.

A photovoltaic cell 218 is placed on the rooftop 212 and is coupled to a rechargeable battery 236. The rechargeable battery 236 is coupled to controller 234. The controller 234, in turn, is coupled to the light emitting diode array 226. The controller 234 is also coupled to a sensor 232. The sensor 232 detects light intensity and temperature within the box like structure or light shaft of skylight 210. The controller also is coupled to a thermal collector 220 adjacent the wall 222 of the skylight 210. The thermal collector 220 is thermally connected to a heat exchanger 230. The heat exchanger in turn is thermally coupled to a hot water supply 231.

In this embodiment, a highly efficient, controllable lighting system that utilizes both natural light and artificial light is obtained. In operation, when natural light is available, the natural light is transmitted to the efficient top diffuser 214 and through the efficient bottom diffuser 228. Additionally, the photovoltaic cell 218 generates electricity for charging battery 236 during daylight hours. Heat that builds up within the skylight 210 due to the natural light from the sun is removed by the thermal collector 220 and provided to a heat exchanger 230 for heating water in a hot water supply 231, which may be used for any conventional purpose such as heating a building or providing hot water to the occupants of the building. When natural light is not available to maintain the required illumination output within the building, the controller 234 may draw on electrical energy stored in the battery 236 to light the light emitting diode array 226. In the event there is insufficient energy stored within the battery 236 to provide adequate lighting with the light emitting diode array 226, the illumination may be supplemented by the controller 234 and relay 246 switching on selected fluorescent lamps 244 powered by power line 248. Power may be drawn from the power line 248 by the controller 234 to provide any desired illumination from either the light emitting diode array 226 or the fluorescent lamp 244. The controller 234 may also, if desired, utilize the power line 248 to recharge the rechargeable batteries 236. The controller 234 preferably includes a transformer or rectifier to convert the one-hundred and twenty volt alternating power line voltage to twelve volts direct current generally used by the light emitting diode array 226.

As can readily be appreciated, the present invention provides a very efficient, substantially self-contained and self-powered natural and artificial lighting system that can be efficiently used in many buildings and homes. The present invention combines natural lighting and artificial lighting that is substantially independent of an external power supply. Additionally, the combined natural light and artificial light system substantially reduces heat transfer into the building due to heat buildup within the box like structure, light shaft, or skylight chamber. This greatly lowers the air conditioning energy load. The artificial light source preferably provides over one hundred and seventy lumens per watt. Additionally, the light emitting diode array provides a color rendition index that closely matches the natural light spectrum for gaining the biological benefit of natural light. The battery discharge may be limited by the controller based on the lumens needed within the building so as to minimize the energy consumption by the system utilizing the lumens per watt characteristics of the light emitting diode array. Therefore, the present invention preferably is able to store sufficient energy over an average day to power the light emitting diode array for at least 12 hours. In the embodiments having the photovoltaic cells within the skylight's interior structure, the photovoltaic cells are sized so as to create a device that has sufficient residual light during daytime operation after collecting solar energy for storage to satisfy the specified foot candle requirements of the desired illumination. The present invention saves close to one hundred percent of the normal electricity used to power conventional incandescent, high intensity discharge lights that have ballast, and conventional fluorescent lights. The present invention also has very high reflective internal surfaces, greater than ninety-five percent reflectivity, to maximize the use of all light captured within the roof mounting device so as to offset the light lost collected from the photovoltaic cells. The controller utilized in the present invention may be a central computer that is programmed to optimize energy draw down on the battery source by exactly controlling the LED power demands for predetermined internal foot candle continuously throughout the year. Additionally, in one embodiment, the controller may provide a solid state computer chip for rectifying and transforming the 120-volt 60 Hz line voltage power supply to power the 12-volt DC requirements of the light emitting diode array. The present invention may also be configured to use external power for powering the light emitting diode array when natural light is not available. Multiple skylight units of the present invention may be ganged together to form multiple units to provide a series source of hot water to augment indigenous hot water supply within the building. The photovoltaic cells may also be placed outside the skylight in some embodiments when such configuration is more adaptable to the installation site.

The present invention may also utilize a solid state blackout lens that permits outside natural light to be blocked so that the interior may be darkened in the daytime. The blackout lens would have minimal impact on light transmission when in the open mode. Additionally, the sealed interior portion of the skylight between the top diffuser and the bottom diffuser may be placed under partial vacuum to increase efficiency and reduce an increase in thermal energy.

In the Fresnel lens embodiment of the invention, the Fresnel lens is mounted within a prismatic diffusion lens. The photovoltaic cell is at the focal point of the Fresnel lens. Preferably, less than ten percent of the area of the prismatic diffusion lens is provided for the area of the Fresnel lens. Incoming solar energy usage is balanced between the requirements of collecting natural light and the Fresnel lens projecting illumination onto the photovoltaic cells so that optimum lighting occurs during daylight hours while a sufficient amount of solar energy is collected and stored in the rechargeable battery so that nighttime lighting can be supplied.

Additionally, the light emitting diode may be controlled to provide linear lumen output. The ability to control the lumen output linearly permits the absolute minimum amount of energy needed to supplement natural light so as to maintain the prescribed level of foot candles in the interior of a building. The high lumens per watt output of the light emitting diode array results in a very efficient illumination system. The highly reflective interior coating used within the light shaft of the skylights may be metal coated plastic sold under the trademark Mylar. The present invention, with the use of the thermal collector and heat exchangers, provides almost a zero heat gain system. By transferring the heat within the skylight to the exterior of the building, the interior of the building does not have any increase in air conditioning load. The present invention also incorporates a photo sensor within the interior of the skylight or light well that may be coupled to the controller so that the artificial light lumen output may be modulated to maintain a fixed preset foot candle requirement within the interior of the building. The controller may automatically draw down on the battery supply to regulate the percentage of artificial light needed. Since the LED technology has a linear lumen watts relationship, precise watt expenditure can be exercised as opposed to conventional on-off systems. Conventional fluorescent lighting systems cannot be linearly modulated. The skylight or light well may also be insulated, to further reducing heat gain within the building.

While various embodiments have been illustrated and described, it should be appreciated that various modifications may be made to the illustrated preferred embodiments without departing from the spirit and scope of this invention.

What is claimed is:

1. A natural and artificial lighting system comprising:
- a light shaft adapted to receive natural light having a top and bottom open end;
- a top diffuser placed on the top open end of said light shaft;
- a bottom diffuser placed on the bottom open end of said light shaft;
- a source of artificial light placed between said top diffuser and said bottom diffuser;
- a rechargeable energy source coupled to said source of artificial light;
- a photovoltaic cell positioned to receive natural light and coupled to said rechargeable energy source; and
- a controller coupled to said source of artificial light and said rechargeable energy source, said controller controlling operation of said source of artificial light,
- whereby the natural light and artificial light system is capable of operating independently of any external electrical power supply.

2. A natural and artificial lighting system as in claim 1 wherein:
- said source of artificial light comprises light emitting diodes.

3. A natural and artificial lighting system as in claim 1 wherein:
- said light shaft has walls that reflect over ninety-five percent of incident radiation.

4. A natural and artificial lighting system as in claim 1 further comprising:
- a Fresnel lens positioned to collect natural light and focus it on said photovoltaic cell.

5. A natural and artificial lighting system as in claim 1 further comprising:
- a thermal collector placed within said light shaft; and
- a heat exchanger coupled to said thermal collector,
- whereby heat from with said light shaft is collected and transferred outside.

6. A natural and artificial lighting system as in claim 1 wherein:
- said photovoltaic cell is placed on a wall of said light shaft.

7. A natural and artificial lighting system used to illuminate the interior of a building comprising:
- a light shaft having a top and bottom open end;
- a top diffuser placed on the top open end of said light shaft;
- a bottom diffuser placed on the bottom open end of said light shaft;
- a light emitting diode array placed between said top diffuser and said bottom diffuser;
- a rechargeable battery;
- a photovoltaic cell coupled to said rechargeable battery;
- a sensor capable of detecting illumination within said light shaft; and
- a controller coupled to said sensor, said rechargeable battery, and said light emitting diode array, said controller controlling operation of said light emitting diode array,
- whereby the natural light and artificial light system is capable of operating substantially independently of any external electrical power supply.

8. A natural and artificial lighting system used to illuminate the interior of a building as in claim 7 further comprising:
- a Fresnel lens placed adjacent said top diffuser and positioned to focus a portion of a natural light source onto said photovoltaic cell.

9. A natural and artificial lighting system used to illuminate the interior of a building as in claim 7 further comprising:
- a thermal collector placed within said light shaft; and
- a heat exchanger coupled to said thermal collector,
- whereby heat from with said light shaft is collected and transferred outside.

10. A natural and artificial lighting system used to illuminate the interior of a building as in claim 7 wherein:
- said light shaft has walls that reflect over ninety-five percent of incident radiation.

11. A natural and artificial lighting system used to illuminate the interior of a building comprising:
- a light shaft having a top and bottom open end;
- a top diffuser placed on the top open end of said light shaft;
- a Fresnel lens placed adjacent a portion of said top diffuser;
- a bottom diffuser placed on the bottom open end of said light shaft;
- a light emitting diode array placed between said top diffuser and said bottom diffuser;
- a rechargeable battery coupled to said light emitting diode array;
- a photovoltaic cell coupled to said rechargeable battery and positioned adjacent said Fresnel lens and positioned to receive light focused by said Fresnel lens;

a sensor capable of detecting illumination within said light shaft; and a controller coupled to said sensor, said rechargeable battery, and said light emitting diode array, said controller controlling operation of said light emitting diode array, whereby the natural light and artificial light system is capable of operating substantially independently of any external power supply.

12. A natural and artificial lighting system used to illuminate the interior of a building as in claim 11 wherein:

the portion of said top diffuser has a surface area smaller than ten percent of said top diffuser.

13. A natural and artificial lighting system used to illuminate the interior of a building as in claim 11 wherein:

said light shaft has walls that reflect over ninety-five percent of incident radiation.

14. A natural and artificial lighting system used to illuminate the interior of a building as in claim 11 further comprising:

a thermal collector placed within said light shaft; and a heat exchanger coupled to said thermal collector, whereby heat from with said light shaft is collected and transferred outside of said light shaft.

15. A combined natural and artificial lighting system comprising:

a light shaft having a top and bottom open end;

a top diffuser placed on the top open end of said light shaft;

a bottom diffuser placed on the bottom open end of said light shaft;

an artificial light source placed between said top diffuser and said bottom diffuser;

a photovoltaic cell coupled to said artificial light source; and a rechargeable battery, whereby the combined natural and artificial lighting system is independent of any external electrical power source.

16. A combined natural light and artificial lighting system as in claim 15 further comprising:

means for substantially reducing heat transfer into the building.

17. A combined natural light and artificial lighting system as in claim 15 wherein:

said artificial light source comprises light emitting diodes.

18. A combined natural light and artificial lighting system as in claim 17 wherein:

the light emitting diodes have a color rendition index that closely matches the natural light spectrum.

19. A combined natural light and artificial lighting system as in claim 17 further comprising:

a controller, said controller regulating said rechargeable battery discharge based on a lumen needed within the building so as to minimize energy consumption by using linear lumen per watt characteristics of the light emitting diodes.

20. A combined natural light and artificial lighting system as in claim 17 wherein:

said rechargeable battery stores sufficient energy to power the light emitting diodes for at least twelve hours.

21. A combined natural light and artificial lighting system as in claim 17 further comprising:

a controller, wherein said controller is optimized to draw down on said rechargeable battery by exact control of said light emitting diode power demand for a predetermined internal foot candle requirement of the building continuously during a one year schedule.

22. A combined natural light and artificial lighting system as in claim 17 further comprising:

a controller capable of providing external power to said light emitting diodes when natural light is not available.

23. A combined natural light and artificial lighting system as in claim 15 wherein:

a natural light collection surface area and the surface area of said photovoltaic cell is sized so that sufficient residual natural light during daytime operation is provided after collecting solar energy for storage to satisfy a predetermined internal foot candle requirement of the building.

24. A combined natural light and artificial lighting systems as in claim 15 wherein:

said light shaft has walls with a reflectivity greater than ninety-five percent.

25. A combined natural light and artificial lighting system as in claim 15 further comprising:

a controller comprising a rectifier capable of transforming alternating current from a 120-volt power line to a 12-volt DC power supply.

26. A combined natural light and artificial lighting system as in claim 15 further comprising:

a thermal collector collecting heat within the system, and a heat exchanger coupled to said thermal collector, whereby heat may be transferred to a source of hot water.

27. A combined natural light and artificial lighting system as in claim 15 wherein:

said photovoltaic cell is placed external to said light shaft.

28. A combined natural light and artificial lighting system as in claim 15 wherein:

said photovoltaic cell is placed on a wall of said light shaft.

* * * * *